(12) United States Patent
Yin et al.

(10) Patent No.: US 11,070,313 B2
(45) Date of Patent: Jul. 20, 2021

(54) STAIRCASE CODE DECODING METHOD AND STAIRCASE CODE DECODING APPARATUS

(71) Applicant: ZTE CORPORATION, Shenzhen (CN)

(72) Inventors: Junjie Yin, Shenzhen (CN); Yi Cai, Shenzhen (CN); Weiming Wang, Shenzhen (CN); Erkun Sun, Shenzhen (CN)

(73) Assignee: ZTE CORPORATION, Shenzhen (CN)

(*) Notice: Subject to any disclaimer, the term of this patent is extended or adjusted under 35 U.S.C. 154(b) by 0 days.

(21) Appl. No.: 16/630,314

(22) PCT Filed: Sep. 10, 2018

(86) PCT No.: PCT/CN2018/104874
§ 371 (c)(1),
(2) Date: Jan. 10, 2020

(87) PCT Pub. No.: WO2019/011352
PCT Pub. Date: Jan. 17, 2019

(65) Prior Publication Data
US 2020/0220653 A1    Jul. 9, 2020

(30) Foreign Application Priority Data
Jul. 10, 2017   (CN) .......................... 201710555990.9

(51) Int. Cl.
*H04L 1/00* (2006.01)
*H04B 10/60* (2013.01)

(52) U.S. Cl.
CPC ........... *H04L 1/0057* (2013.01); *H04B 10/60* (2013.01); *H04L 1/0052* (2013.01)

(58) Field of Classification Search
None
See application file for complete search history.

(56) References Cited

U.S. PATENT DOCUMENTS

| | | | |
|---|---|---|---|
| 8,489,956 B2 * | 7/2013 | Yokokawa | H03M 13/2707 714/752 |
| 8,656,244 B1 * | 2/2014 | Chang | H03M 13/6368 714/752 |

(Continued)

FOREIGN PATENT DOCUMENTS

| | | | |
|---|---|---|---|
| CN | 105429646 A | * | 3/2016 |
| CN | 105429646 A | | 3/2016 |

OTHER PUBLICATIONS

Zhang, L.M. et al. "Staircase Codes with 6% to 33% Overhead" Journal of Lightwave Technology, vol. 32, No. (10), May 15, 2014, entire document.

(Continued)

*Primary Examiner* — David W Lambert
(74) *Attorney, Agent, or Firm* — Bond Schoeneck & King, PLLC; George McGuire

(57) ABSTRACT

Provided are a staircase code decoding method and a staircase code decoding apparatus. The method includes: step 1, obtaining the length L of a sliding window, and continuously obtaining, starting from a P-th subcode block, L subcode blocks as first to-be-decoded subcode blocks in the sliding window; step 2, dividing the first to-be-decoded subcode blocks into a plurality of first to-be-decoded groups, respectively decoding the plurality of to-be-decoded groups to be decoded, and updating the plurality of first to-be-decoded groups according to a decoding result to obtain first updated subcode blocks; step 3, sliding the sliding window forwards by a length of N subcode blocks; step 4, dividing second to-be-decoded subcode blocks into a plurality of second to-be-decoded groups, decoding the plurality of second (Continued)

to-be-decoded groups, obtaining second updated subcode blocks, and outputting first M subcode blocks among the second updated subcode blocks; and step 5, sliding the sliding window backwards by S.

12 Claims, 11 Drawing Sheets

(56) References Cited

U.S. PATENT DOCUMENTS

| | | | |
|---|---|---|---|
| 2012/0266051 A1* | 10/2012 | Farhoodfar | H03M 13/2918 714/782 |
| 2014/0237325 A1 | 8/2014 | Farhoodfar et al. | |
| 2018/0083653 A1* | 3/2018 | Khayat | G11C 29/52 |

OTHER PUBLICATIONS

Smith, B.P. et al. "Staircase Codes: FEC for 100 Gb/s OTN" Journal of Lightwave Technology, vol. 30, No. (1) Jan. 1, 2012, entire documents.
International Search Report and Written Opinion Form PCT/ISA/210 and PCT/ISA237, International Application No. PCT/CN2018/104874 pp. 1-6, International Filing Date Sep. 10, 2018, dated Nov. 30, 2018.

* cited by examiner

STAIRCASE CODE DECODING METHOD AND STAIRCASE CODE DECODING APPARATUS

CROSS-REFERENCES TO RELATED APPLICATIONS

This is a National Stage Application, filed under 35 U.S.C. 371, of International Patent Application No. PCT/CN2018/104874, filed on Sep. 10, 2018, which claims priority to a Chinese patent application No. 201710555990.9 filed on Jul. 10, 2017, disclosure of which is incorporated herein by reference in its entirety.

TECHNICAL FIELD

The present application relates to forward error correction (FEC) in optical communications and, for, to a staircase code decoding method and a staircase code decoding apparatus.

BACKGROUND

The FEC technology has been widely used in optical communication systems to improve bit error rate performance and improve reliability of system communication. The staircase code is a new-type FEC code, which combines ideas of the conventional code and the product code. The coding manner of the staircase code is similar to the coding manner of the product code. In the staircase code, any two adjacent subcode blocks have a strong correlation, that is, any two adjacent staircase code subcode blocks may be combined into a complete Bose, Ray-Chaudhuri, Hocquenghem (BCH) code block unit, and in such a way, the whole staircase code may be considered as a chain structure whose length tends to infinity. In a decoding manner of the staircase code, each time decoding output of subcode blocks of one staircase code is completed, the decoding process needs to be repeated multiple times, and in order to acquire higher decoding performance, the number of times of decoding needs to be increased, so that a hardware circuit has high implementation complexity, large power consumption, large decoding delay, and poor performance after decoding.

SUMMARY

The following is a summary of the subject matter described herein in detail. This summary is not intended to limit the scope of the claims.

The present applicant provides a staircase code decoding method and a staircase code decoding apparatus, to avoid the problem in the related art of high implementation complexity, large power consumption, large decoding delay, and poor decoding performance of a hardware circuit used for decoding of an FEC code.

In an aspect of the present application, a staircase code decoding method is provided and includes steps 1 to 5 described below.

In step 1, a length L of a sliding window is obtained, and L subcode blocks, starting from a P-th subcode block, are continuously obtained from the received subcode blocks received according to a front-to-back order based on a receiving time, and the continuously obtained L subcode blocks are used as first to-be-decoded subcode blocks in the sliding window, where P is a positive integer greater than or equal to 1, and L is a positive integer.

In step 2, the first to-be-decoded subcode blocks are divided into multiple first to-be-decoded groups, the multiple first to-be-decoded groups to be decoded are decoded respectively, and the multiple first to-be-decoded groups are updated according to a decoding result of the multiple first to-be-decoded groups to obtain first updated subcode blocks.

In step 3, the sliding window is slid forwards by a length of N subcode blocks according to the receiving time, and the first updated subcode blocks remaining in the sliding window and the N subcode blocks slid into the sliding window are used as second to-be-decoded subcode blocks, where N is less than P.

In step 4, the second to-be-decoded subcode blocks are divided into multiple second to-be-decoded groups, the multiple second to-be-decoded groups are decoded, the multiple second to-be-decoded groups are updated according to a decoding result of the multiple second to-be-decoded groups to obtain second updated subcode blocks, and first M subcode blocks in the second updated subcode blocks are outputted as a decoding result.

In step 5, the sliding window is slid backwards by a length of S subcode blocks according to the receiving time, the second updated subcode blocks remaining in the sliding window and the S subcode blocks slid into the sliding window are used as the first to-be-decoded subcode blocks, and return to step 2 to continue executing until a decoding result of all the subcode blocks is outputted, where S is a sum of M and N.

Embodiments of the present application further provide a staircase code decoding apparatus. The apparatus includes a first to-be-decoded subcode block obtaining module, a first decoding module, a first sliding module, a second decoding module and a second sliding module.

The first to-be-decoded subcode block obtaining module is configured to obtain a length L of a sliding window, continuously obtain L subcode blocks, starting from a P-th subcode block, from received subcode blocks received according to a front-to-back order based on a receiving time, and use the continuously obtained L subcode blocks as first to-be-decoded subcode blocks in the sliding window, where P is a positive integer greater than or equal to 1, and L is a positive integer.

The first decoding module is configured to divide the first to-be-decoded subcode blocks into multiple first to-be-decoded groups, decode the multiple first to-be-decoded groups respectively, and update the multiple first to-be-decoded groups according to a decoding result of the multiple first to-be-decoded groups to obtain first updated subcode blocks.

The first sliding module is configured to slide the sliding window forwards by a length of N subcode blocks according to the receiving time, and use the first updated subcode blocks remaining in the sliding window and the N subcode blocks slid into the sliding window as second to-be-decoded subcode blocks, where N is less than P.

The second decoding module is configured to divide the second to-be-decoded subcode blocks into multiple second to-be-decoded groups, decode the multiple second to-be-decoded groups, update the multiple second to-be-decoded groups according to a decoding result of the multiple second to-be-decoded groups to obtain second updated subcode blocks, and output first M subcode blocks in the second updated subcode blocks as the decoding result.

The second sliding module is configured to slide the sliding window backwards by a length of S subcode blocks according to the receiving time, use the second updated subcode blocks remaining in the sliding window and the S subcode blocks slid into the sliding window as the first to-be-decoded subcode blocks, and return to trigger the first sliding module and the second decoding module until decoding results of all the subcode blocks are outputted, where S is a sum of M and N.

The embodiments of the present application further provide a storage medium. The storage medium includes stored programs where the programs, when executed, perform the method of any one of the embodiments described above.

The embodiments of the present application further provide a processor. The processor is configured to execute programs which, when executed, perform the method of any one of the embodiments described above.

The present application further provides a staircase code decoding method. The method includes steps 1 to 5 described below.

In step 1, a length L of a sliding window is obtained, L subcode blocks, starting from a P-th subcode block, are continuously obtained from the received subcode blocks received according to a front-to-back order based on a receiving time, the continuously obtained L subcode blocks are used as first to-be-decoded subcode blocks in the sliding window, where P is a positive integer greater than or equal to 1, and L is a positive integer.

In step 2, the first to-be-decoded subcode blocks are divided into multiple first to-be-decoded groups, the multiple groups to be decoded are decoded respectively, and the multiple first to-be-decoded groups are updated according to a decoding result of the first to-be-decoded subcode blocks to obtain first updated subcode blocks.

In step 3, the sliding window is slid forwards by a length of N subcode blocks according to the receiving time, and the first updated subcode blocks remaining in the sliding window and the N subcode blocks slid into the sliding window are used as second to-be-decoded subcode blocks, where N is less than P; and the second to-be-decoded subcode blocks are divided into multiple second to-be-decoded groups, the multiple second to-be-decoded groups are decoded, and the multiple second to-be-decoded groups are updated according to a decoding result of the multiple second to-be-decoded groups to obtain second updated subcode blocks.

In step 4, the sliding window is slid backwards by a length of N subcode blocks according to the receiving time, and the second updated subcode blocks remaining in the sliding window and the N subcode blocks slid into the sliding window are used as the first to-be-decoded subcode blocks, where N is less than P; and steps 2 and 3 are performed again. The step is repeated K times, where K is an integer greater than or equal to 0, and when K is 0, which means that the step cannot be performed, directly go to step 5.

In step 5, after the second updated subcode blocks are obtained, first M subcode blocks in the second updated subcode blocks are outputted as the decoding result; and the sliding window is slid backwards by a length of S subcode blocks according to the receiving time, the second updated subcode blocks remaining in the sliding window and the S subcode blocks slid into the sliding window are used as the first to-be-decoded subcode blocks, and return to step 2 until decoding results of all the subcode blocks are outputted.

In an embodiment, S is a sum of M and N.

In an embodiment, M is 1 or 2.

The embodiments of the present application further provide a staircase code decoding apparatus. The apparatus includes a first to-be-decoded subcode block obtaining module, a first decoding module, a first sliding module, a second decoding module and a second sliding module.

The first to-be-decoded subcode block obtaining module is configured to obtain a length L of a sliding window, continuously obtain L subcode blocks, starting from a P-th subcode block, from the received subcode blocks received according to a front-to-back order based on a receiving time, use the continuously obtained L subcode blocks as first to-be-decoded subcode blocks in the sliding window, where P is a positive integer greater than or equal to 1, and L is a positive integer.

The first decoding module is configured to divide the first to-be-decoded subcode blocks into multiple first to-be-decoded groups, decode the multiple first to-be-decoded groups respectively, and update the multiple first to-be-decoded groups according to a decoding result of the multiple first to-be-decoded groups to obtain first updated subcode blocks.

The first sliding module is configured to slide the sliding window forwards by a length of N subcode blocks according to the receiving time, and use the first updated subcode blocks remaining in the sliding window and the N subcode blocks slid into the sliding window as second to-be-decoded subcode blocks, where N is less than P; and divide the second to-be-decoded subcode blocks into multiple second to-be-decoded groups, decode the multiple second to-be-decoded groups, and update the multiple second to-be-decoded groups according to a decoding result of the multiple second to-be-decoded groups to obtain second updated subcode blocks.

The second decoding module is configured to slide the sliding window backwards by a length of N subcode blocks according to the receiving time, and use the second updated subcode blocks remaining in the sliding window and the N subcode blocks slide into the sliding window as the first to-be-decoded subcode blocks, where N is less than P; and trigger the first decoding module and the first sliding module; where the second sliding module is triggered repeatedly K times, where K is an integer greater than or equal to 0, and when K is 0, which means that step 4 the second decoding module cannot be [[performed]]triggered, the second sliding module is directly go to step 5 triggered.

The second sliding module is configured to, after the second updated subcode blocks are obtained, output first M subcode blocks in the second updated subcode blocks as the decoding result; and slide the sliding window backwards by a length of S subcode blocks according to the receiving time, use the second updated subcode blocks remaining in the sliding window and the S subcode blocks slid into the sliding window as the first to-be-decoded subcode blocks, and return to step 2 trigger the first decoding module and the second decoding module until decoding results of all the subcode blocks are outputted.

In an embodiment, S is a sum of M and N.

In an embodiment, M is 1 or 2.

The embodiments of the present application further provide a storage medium. The storage medium includes stored programs where the programs, when executed, perform the method of any one of the embodiments described above.

The embodiments of the present application further provide a processor. The processor is configured to execute programs which, when executed, perform the method of any one of the embodiments described above.

Other aspects can be understood after the drawings and the detailed description are read and understood.

BRIEF DESCRIPTION OF DRAWINGS

The drawings are only used for the purpose of illustrating part of embodiments and are not construed as a limit of the present application. The same reference numerals in the drawings indicate the same components. In the drawings.

DETAILED DESCRIPTION

Exemplary embodiments of the present disclosure will be described in detail with reference to the drawings. The drawings illustrate the exemplary embodiments of the present disclosure, but it should be understood that the present disclosure may be implemented in various ways and should not be limited to the embodiments set forth herein. These embodiments are provided for a thorough understanding of the present disclosure and to fully convey the scope of the present disclosure to those skilled in the art.

Figure 1:
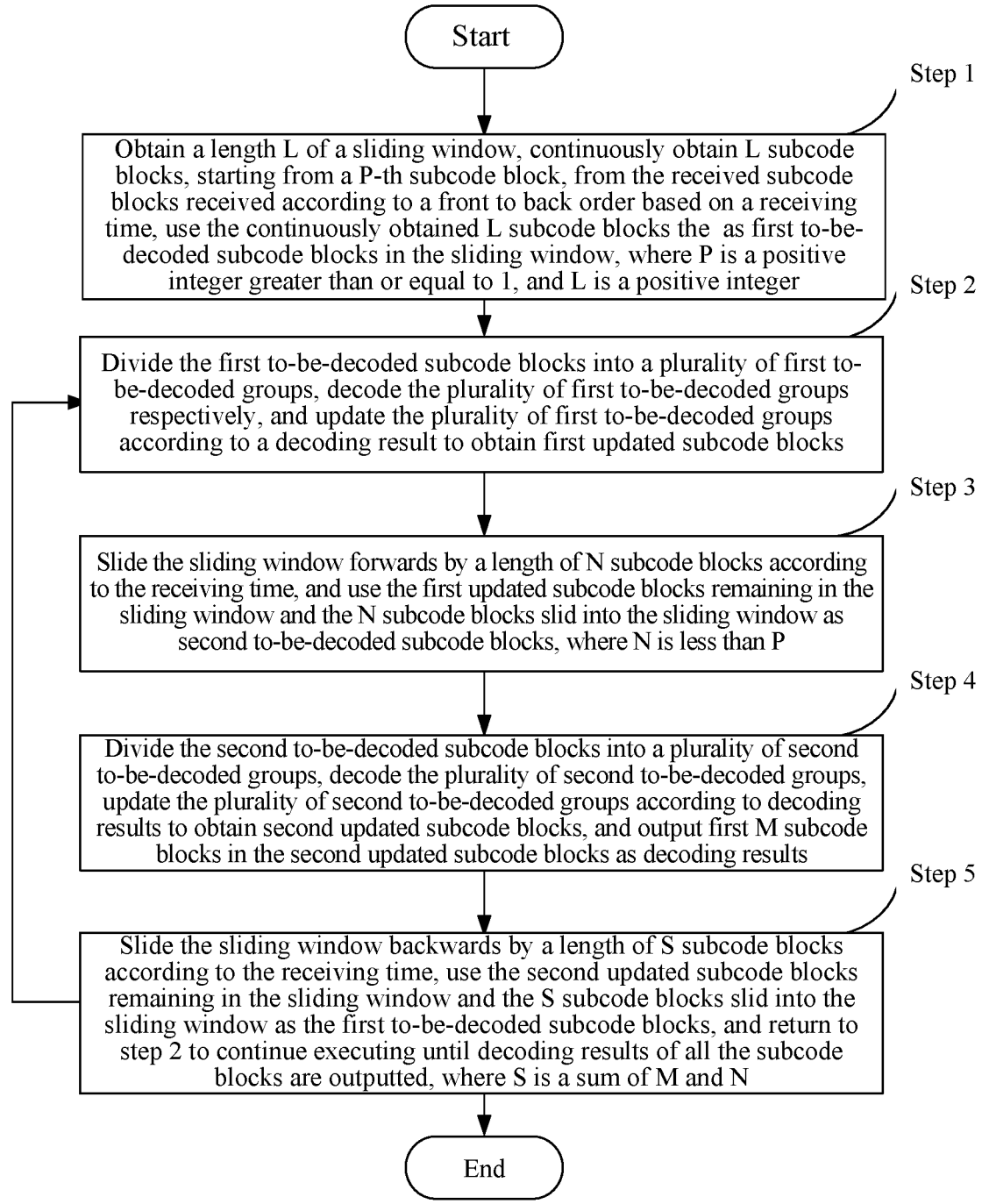
FIG. 1 is a flowchart of a staircase code decoding method according to a method embodiment one of the present application.

FIG. 1 is a flowchart of a staircase code decoding method according to a method embodiment one of the present application. As shown in FIG. 1, the staircase code decoding method in the method embodiment one of the present application includes the steps 1 to 5.

In step 1, a length L of a sliding window is obtained, L subcode blocks, starting from a P-th subcode block are continuously obtained from the received subcode blocks received according to a front-to-back order based on a receiving time, and the continuously obtained L subcode blocks are used as first to-be-decoded subcode blocks in the sliding window, where P is a positive integer greater than or equal to 1, and L is a positive integer.

In an embodiment, the sliding window is set to slide forwards or backwards in subcode blocks to be detected during staircase code decoding, and to assist a certain decoding method for decoding. The length L of the sliding window may be preset according to requirements. In the method provided in this embodiment, the L subcode blocks are continuously obtained according to the front-to-back order based on a receiving time as the subcode blocks to be decoded in the sliding window. The L may be set to be a positive integer greater than 2 to ensure the complete implementation of the method described in this embodiment. The continuously obtaining from the P-th subcode block is to prepare for subsequent sliding forwards of the sliding window.

In an embodiment, L is an even number.

In step 2, the first to-be-decoded subcode blocks are divided into multiple first to-be-decoded groups, the multiple first to-be-decoded groups are decoded respectively, and the multiple first to-be-decoded groups are updated according to a decoding result of the multiple first to-be-decoded groups to obtain first updated subcode blocks.

In an embodiment, the first to-be-decoded subcode blocks in the sliding window are divided into multiple first to-be-decoded groups, and the multiple first to-be-decoded groups are decoded respectively, and since the multiple first to-be-decoded groups are decoded respectively, the subcode blocks to be decoded in each pair of the multiple first to-be-decoded groups can be decoded respectively according to a certain order, or multiple first to-be-decoded groups can be decoded simultaneously, but the decoding processes among the multiple first to-be-decoded groups are not associated.

In step 3, the sliding window is slid forwards by a length of N subcode blocks according to the receiving time, and the first updated subcode blocks remaining in the sliding window and the N subcode blocks slide into the sliding window are used as second to-be-decoded subcode blocks, where N is less than P. In an embodiment, N is 1.

In an embodiment, after the sliding window is slid forwards by N subcode blocks, N subcode blocks received earlier are slid into the sliding window and N subcode blocks received later are slid out of the sliding window. Since the subcode blocks are continuously obtained from the P-th subcode block, N slid forward must be less than P.

In step 4, the second to-be-decoded subcode blocks are divided into multiple second to-be-decoded groups, the multiple second to-be-decoded groups are decoded, the multiple second to-be-decoded groups are updated according to a decoding result of the multiple second to-be-decoded groups, second updated subcode blocks are obtained, and first M subcode blocks in the second updated subcode blocks are outputted.

In an embodiment, the second to-be-decoded subcode blocks in the sliding window are divided into multiple second to-be-decoded groups, and the multiple second to-be-decoded groups are decoded respectively, and since the multiple second to-be-decoded groups are decoded respectively, the subcode blocks to be decoded in each pair of the multiple second to-be-decoded groups can be decoded respectively according to a certain order, or multiple second to-be-decoded groups can be decoded simultaneously, but the decoding processes among the multiple second to-be-decoded groups are not associated.

The outputted first M subcode blocks in the second updated subcode blocks are the second updated subcode blocks corresponding to M second to-be-decoded subcode blocks that received the earliest in the sliding window in a sequence of receiving time from front to back. Since the M first subcode blocks in the second updated subcode blocks are directly outputted as decoding results in this step, under the premise that decoding rate requirements and expected accuracy requirements are met, the value of M should be set as small as possible. The M may be set to be a positive integer less than 10, and in an embodiment, M is 2.

In step 5, the sliding window is slid backwards by a length of S subcode blocks according to the receiving time, the second updated subcode blocks remaining in the sliding window and the S subcode blocks slid into the sliding window are used as the first to-be-decoded subcode blocks, and return to step 2 to continue executing until the decoding result of all the subcode blocks is outputted, where S is a sum of M and N.

In an embodiment, if N=1 and M=2, S=3.

In an embodiment, after the first M subcode blocks in the second updated subcode blocks are outputted, the sliding window is slid backwards by the S subcode blocks, second updated subcode blocks still remaining in the sliding window after the sliding and new sild-in subcode blocks are used as new first to-be-decoded subcode blocks of the sliding window, return to step 2 to performing grouping and decoding, and first M subcode blocks are outputted as decoding results until all second update subcode blocks corresponding to the subcode block are outputted as the decoding results, or end the above iterative decoding steps at set subcode block positions according to requirements.

The staircase code decoding method provided by this embodiment divides subcode blocks to be decoded in the sliding window into multiple groups, decodes the multiple groups respectively, re-groups and re-decodes second to-be-decoded subcode blocks in the window after sliding to obtain second updated subcode blocks after the subcode blocks to be decoded are updated according to decoding results to obtain first updated subcode blocks and after the sliding window is slid forwards by N subcode blocks, slides the sliding window backwards by S subcode blocks after first M subcode blocks among the second updated subcode blocks are outputted as decoding results, where S is a sum of M and N, and then returns to the step of obtaining the first updated subcode blocks for iterative decoding, so as to output updated subcode blocks as decoding results. Each time decoding output of subcode blocks of a staircase code is completed, only a limited number of iterative decoding processes need to be performed, thereby reducing implementation complexity of a hardware circuit, reducing decoding delay, and improving decoding performance.

Figure 2:
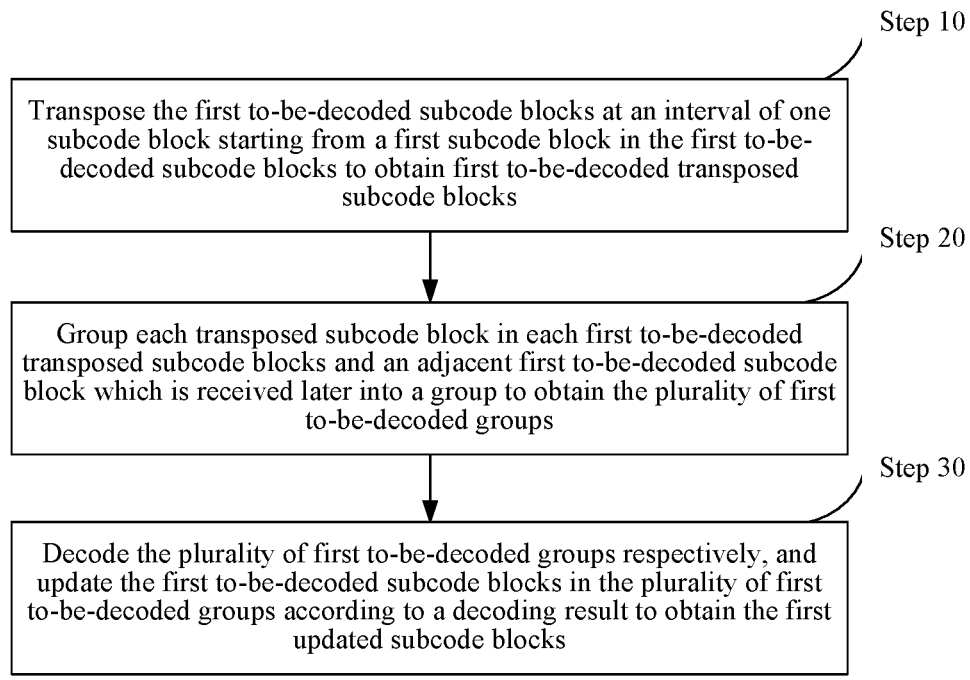
FIG. 2 is a flowchart of group decoding of a staircase code decoding method according to a method embodiment two of the present application.

FIG. 2 is a flowchart of group decoding of a staircase code decoding method according to a method embodiment two of the present application. The staircase code decoding method in the method embodiment two of the present application shown in FIG. 2 is an implementation mode of the steps in the embodiment 1 that the first to-be-decoded subcode blocks are divided into multiple first to-be-decoded groups, the multiple first to-be-decoded groups are decode respectively, and the multiple first to-be-decoded groups are updated according to the decoding results to obtain first updated subcode blocks, and includes steps 10, 20 and 30.

In step 10, the first to-be-decoded subcode blocks are transposed at an interval of one subcode block starting from a first subcode block in the first to-be-decoded subcode blocks to obtain first to-be-decoded transposed subcode blocks.

In an embodiment, according to characteristics of the staircase code, when decoding is performed with two subcode blocks in a group, one of subcode blocks needs to be transposed, and in the method provided by this embodiment, from the first subcode block to be decoded, the first to-be-decoded subcode blocks are transposed at interval of one first subcode block to be decoded to obtain the first transposed subcode block to be decoded.

In step 20, each transposed subcode block infirst to-be-decoded transposed subcode blocks and an adjacent first subcode block to be decoded which is received later are grouped into a group to obtain the multiple first to-be-decoded groups.

In an embodiment, in each obtained first group to be decoded, the first to-be-decoded subcode blocks received earlier are transposed, and the first to-be-decoded subcode blocks received later are not transposed.

In step 30, the multiple first groups to be decode are decoded respectively, and the first to-be-decoded subcode blocks in the multiple first subcode groups to be decoded are updated according to decoding results to obtain the first updated subcode blocks.

In an embodiment, the multiple first to-be-decoded groups are decoded respectively in rows, decoding between the multiple first to-be-decoded groups is not associated with each other, and a decoding sequence may be arbitrarily set according to requirements or the decoding may be performed simultaneously. It is to be noted that this embodiment mainly completes grouping and decoding on the subcode blocks to be decoded. The steps of the grouping may also be that the first to-be-decoded subcode blocks are grouped according to the receiving time with two adjacent first to-be-decoded subcode blocks as a group to obtain the multiple first to-be-decoded groups, each first to-be-decoded subcode block belongs to only one first to-be-decoded group, and then, the subsequent decoding steps are performed after the first to-be-decoded subcode blocks received earlier in the first to-be-decoded groups are transposed.

In the staircase code decoding method provided in this embodiment, after every two of the first to-be-decoded subcode blocks in the sliding window are grouped into a group according to the sequence of receiving time from front to back to obtain the multiple first to-be-decoded groups, the first to-be-decoded subcode blocks are decoded and updated respectively. The first to-be-decoded subcode blocks are divided into multiple groups, and then the multiple groups are decoded respectively, which greatly improves the decoding rate of the staircase code.

In an embodiment, the step that the second to-be-decoded subcode blocks are divided into multiple second to-be-decoded groups, the multiple second to-be-decoded groups are decoded, and the multiple second to-be-decoded groups are updated according to the decoding result of the multiple second to-be-decoded groups to obtain the second updated subcode blocks includes: from a first subcode block in the second to-be-decoded subcode blocks, transposing subcode blocks corresponding to the second to-be-decoded subcode blocks at interval of one code block to obtain second to-be-decoded transposed subcode blocks; grouping each transposed subcode block in the second to-be-decoded transposed subcode blocks and an adjacent second subcode block to be decoded which is received later into a group to obtain the multiple second to-be-decoded groups; and respectively decoding the multiple second to-be-decoded groups, and updating the second to-be-decoded subcode blocks in the multiple second to-be-decoded groups according to the decoding result of the multiple second to-be-decoded groups to obtain the second updated subcode blocks.

In an embodiment, the description of this embodiment is the same as the description of the embodiment 2 shown in FIG. 2. In the staircase code decoding method provided in this embodiment, after every two of the second to-be-decoded subcode blocks in the sliding window are grouped into a group according to the sequence of receiving time from front to back to obtain the multiple second to-be-decoded groups, the multiple second to-be-decoded groups are decoded respectively, and the second to-be-decoded subcode blocks are updated respectively. The second to-be-decoded subcode blocks are divided into multiple groups, and then the multiple groups are decoded respectively, which greatly improves the decoding rate of the staircase code.

In an embodiment, the step of decoding the first to-be-decoded groups respectively includes: when the first to-be-decoded subcode blocks in the first to-be-decoded groups are codes which are subjected to a hard decision, performing decoding by using linear packet codes; and when the first to-be-decoded subcode blocks are not codes which are subjected to a hard decision, performing decoding by using a soft decoding algorithm. This embodiment supports different decoding modes for different first to-be-decoded subcode blocks, extending an application range of the staircase code decoding provided by the present application.

It is to be noted that the decoding of the second to-be-decoded groups respectively is the same as the decoding of the to-be-decoded first groups, and the decoding process will not be repeated herein.

In an embodiment, the step that the L subcode blocks are continuously obtained as the subcode blocks to be decoded in the sliding window includes: when a first obtained subcode block is a subcode block first received in all the subcode blocks, supplementing an all zero code block as a first subcode block to be decoded in the sliding window, and sliding an L-th subcode block to be decoded in the sliding window out of the sliding window; and the step that the multiple first to-be-decoded groups are updated according to the decoding results includes: updating the subcode blocks to be decoded other than the all zero code block according to the decoding results. In this embodiment, when a first received subcode block to be decoded in the sliding window is a subcode block first received in all the subcode blocks, a first position of the sliding window needs to be supplemented with an all zero code block, so as to decode the first subcode block to be decoded. This embodiment, by supplementing an all zero code block before the first subcode block, avoids the decoding after the first subcode blocks are grouped, extending the application range of the staircase code decoding provided by the present application.

Figure 3:
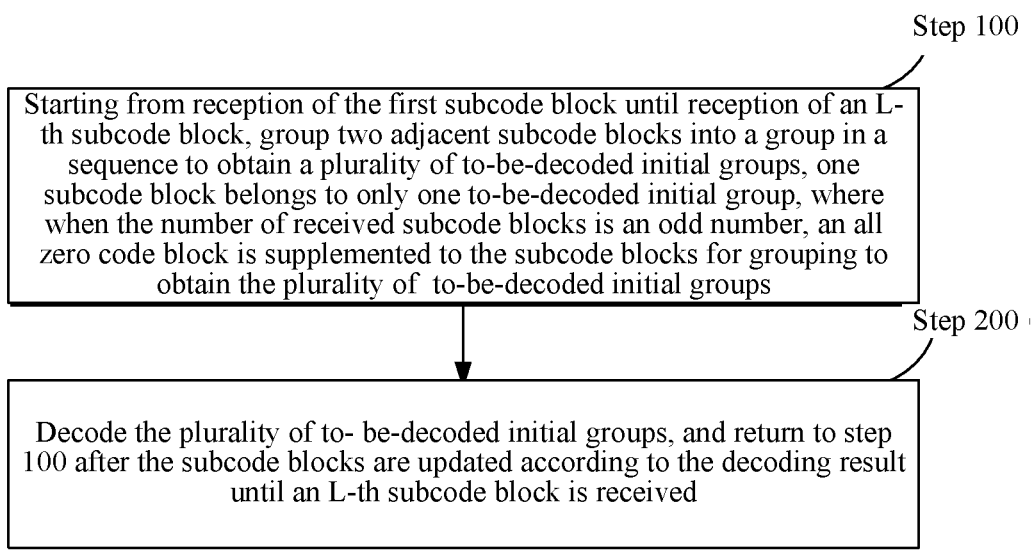
FIG. 3 is a flowchart of a staircase code decoding method according to a method embodiment three of the present application.

FIG. 3 is a flowchart of a staircase code decoding method according to a method embodiment three of the present application. As shown in FIG. 3, the staircase code decoding method in the method embodiment three of the present application is an implementation mode of steps before the step 1 of the embodiment 1 of the present application, and includes the steps 100 and 200.

In step 100, starting from reception of the first subcode block, two adjacent subcode blocks are grouped into a group in a sequence to obtain multiple initial to-be-decoded groups, one subcode block belongs to only one to-be-decoded initial group, where when the number of received subcode blocks is an odd number, an all zero code block are supplemented to the subcode blocks for grouping to obtain the multiple initial to-be-decoded groups.

In an embodiment, before the step 1 of the embodiment one, when the number of received subcode blocks is less than L, in order to improve the decoding accuracy of the staircase code, this embodiment groups the received subcode blocks: when a first subcode block is received, the first subcode block and the supplemented all zero code block are grouped into a group; when a second subcode block is received, the first and the second subcode blocks are grouped into a group; when a third subcode block is received, the all zero code block and the first subcode block are grouped into a group, the second and the third subcode blocks are grouped into a group, and so on.

In each to-be-decoded initial group, the subcode blocks received earlier need to be transposed.

In step 200, the multiple initial to-be-decoded groups are decoded, and return to step 100 after the subcode blocks are updated according to decoding results until the L-th subcode block is received.

In an embodiment, from the first received subcode block, after the first subcode block and the all zero code block are grouped into a first to-be-decoded initial group, the first to-be-decoded initial group is decoded, and the first subcode block is updated according to the decoding result of the first to-be-decoded initial group while the all zero code block is not updated.

When a second subcode block is received, after the updated first subcode block and the received second subcode block are grouped into a second to-be-decoded initial group, the second to-be-decoded initial group is decoded, the first and the second subcode blocks are updated, and so on until the L-th subcode block is received.

In the staircase code decoding method provided by this embodiment, before the preset length of the sliding window, L subcode blocks, is received, the decoding process of initializing the received subcode blocks is performed in a manner where two subcode blocks are grouped into a group, and through the initialization decoding process, before subsequent decoding processes start, the received subcode blocks have already been decoded by complete iterative decoding, thereby reducing the decoding bit error rate of the staircase code provided by the present application.

The following illustrates initialization decoding and normal decoding processes of hard decoding, soft decoding and a combination of soft and hard decoding of the present application respectively by way of examples.

Figure 4:
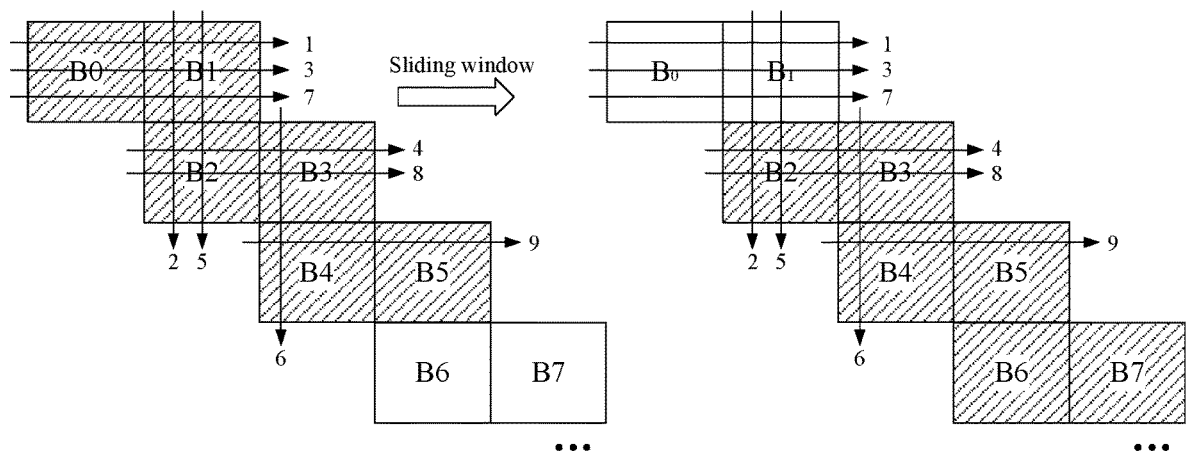
FIG. 4 is a flowchart of an initialization decoding method of hard decoding of a staircase code according to a method embodiment four of the present application.

FIG. 4 is a flowchart of an initialization decoding method of hard decoding of a staircase code according to a method embodiment four of the present application. Using L=6 as an example, when the received codes are codes which are subjected to a hard decision, linear packet code hard decoding is directly performed in the decoding process, and when the number of subcode blocks received initially is less than 6, to decode received data is also recommended, so that when the number of received subcode blocks reaches 6, the decoding output will undergo complete iterative decoding three times (one iterative decoding includes a horizontal and a vertical decoding).

The initialization decoding method of hard decoding of the staircase code of the method embodiment four of the present application shown in FIG. 4 is as follows.

When a first subcode block B1 is received, [BT0, B1] are decoded (shown by the solid arrow 1 in the left figure of FIG. 4), and only information in code block B1 is updated, where T represents transpose, and BT0 represents the transpose of an all zero code block.

When a second subcode block B2 is received, [BT1, B2] are decoded (shown by the solid arrow 2 in the left figure of FIG. 4), and information in both code blocks B1 and B2 is updated, where BT1 represents the transpose of the updated subcode block B1. When a third subcode block B3 is received, [BT0, B1] and [BT2, B3] are decoded (shown by the solid arrows 3 and 4 in the left figure of FIG. 4), and information in code blocks B1, B2 and B3 is updated, where BT2 represents the transpose of the updated subcode block B2.

When a fourth subcode block B4 is received, [BT1, B2] and [BT3, B4] are decoded (shown by the solid arrows 5 and 6 in the left figure of FIG. 4), and information in code blocks B1, B2, B3 and B4 is updated.

When a fifth subcode block B5 is received, [BT0, B1], [BT2, B3] and [BT4, B5] are decoded (shown by the solid arrows 7, 8 and 9 in the left figure of FIG. 4), and information in code blocks B1, B2, B3, B4 and B5 is updated, where BT2 represents the transpose of the updated subcode block B2.

If the subcode block B0 is counted, 6 subcode blocks exist in the sliding window (shown by the slash section in the left figure of FIG. 4), but since the subcode block B0 is not a code block actually received, but an all zero code block agreed in the staircase code, there is no decoding output after the initialization decoding is completed. New received code blocks are subcode blocks B6 and B7, and in this case, the sliding window is slid backwards by a length of 2 code blocks (shown by the slash section in the right figure of FIG. 4). In this case, 6 subcode blocks included in new positions of the sliding window are B2, B3, B4, B5, B6 and B7 respectively. In actual implementation, the sliding window corresponds to a buffer apparatus in a circuit.

Figure 5:
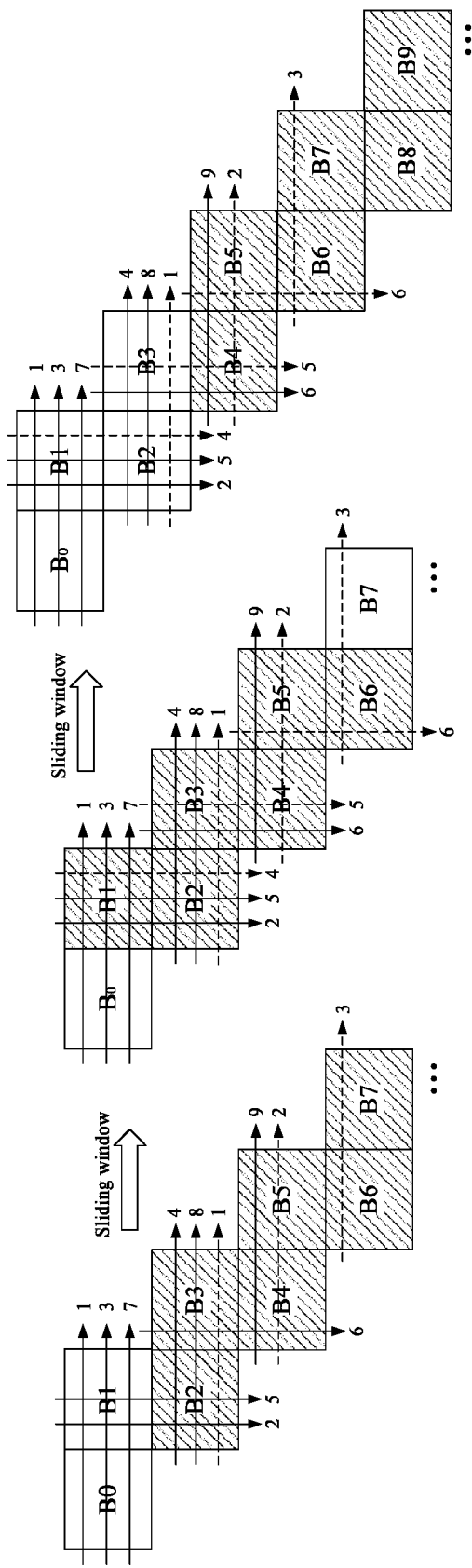
FIG. 5 is a flowchart of a decoding method of hard decoding of a staircase code according to a method embodiment four of the present application.

FIG. 5 is a flowchart of a decoding method of hard decoding of a staircase code according to a method embodiment four of the present application. Using L=6 as an example, when the received codes are codes which are subjected to a hard decision, linear packet code hard decoding is directly performed in the decoding process. The decoding method of hard decoding of a staircase code in the method embodiment four of the present application shown in FIG. 5 includes steps 1 to 6.

In step 1, 6 subcode blocks in the sliding window (shown by the slash section in the left figure of FIG. 5) are divided into 3 groups by grouping two adjacent subcode blocks into one unit: [BT2, B3], [BT4, B5] and [BT6, B7] (where T represents the transpose); for the sake of convenience of the following description, these groups are respectively referred to as: B(1)=[BT2, B3], B(2)=[BT4, B5] and B(3)=[BT6, B7].

In step 2, code group units B(1), B(2) and B(3) are decoded respectively in rows (shown by dotted arrows 1, 2 and 3 in the left figure of FIG. 5); at the same time, information of two subcode blocks in code blocks B(1), B(2) and B(3) is updated.

It is to be noted that if the received staircase codes are codes which are subjected to a hard decision, BCH hard decoding is directly performed in the decoding process; and if soft information which is not subjected to a hard decision is received, the decoding method is turbo soft decoding algorithm. At the same time, it can be seen from the above method that B1, B2, B3, B4 and B5 have been decoded several times after undergoing the process of initialization decoding, so that the outputted B1 undergoes iterative decoding three times (a complete iterative decoding includes a horizontal and a vertical decoding).

In step 3, the sliding window is slid forwards by a length of one code block, and 6 staircase code subcode blocks included in new positions of the sliding window are B1, B2, B3, B4, B5 and B6 respectively (shown by the slash section in FIG. 5); and these 6 subcode blocks are divided into 3 groups by grouping two adjacent subcode blocks into one unit: B(1)=[BT1, B2], B(2)=[BT3, B4] and B(3)=[BT5, B6].

In step 4, code group units B(1), B(2) and B(3) are decoded respectively (shown by dotted arrows 4, 5 and 6 in FIG. 5); at the same time, information of code blocks B(1), B(2) and B(3) is updated, and B1 and B2 in B(1) are outputted; such outputted B1 and B2 also undergo iterative decoding three times.

In step 5, the sliding window is slid backwards by a length of three code blocks, and 6 staircase code subcode blocks included in new positions of the sliding window are B4, B5, B6, B7, B8 and B9 respectively (shown by the slash section in the right figure of FIG. 5, where i>=0); and then operations in steps S11 to S14 1 to 4 are repeated, and corresponding B3 and B4 in B(1) are outputted.

In step 6, operations in step [[S15]]5 are repeated, so as to complete decoding output of B5, B6, . . . , and other staircase code subcode blocks.

In this embodiment, each time decoding output of subcode blocks of one staircase code is completed, only three times of code block iterative decoding processes are needed. Therefore, the implementation complexity of a hardware circuit is greatly reduced; at the same time, the decoding delay is also greatly reduced, which facilities metro application of the network; in addition, the performance is better improved.

Figure 6:
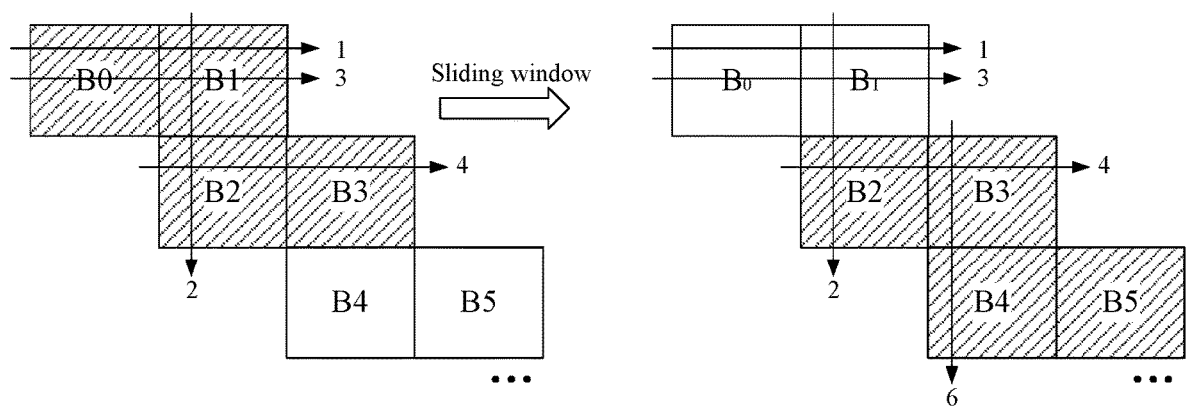
FIG. 6 is a flowchart of an initialization decoding method of soft decoding of a staircase code according to a method embodiment five of the present application.

FIG. 6 is a flowchart of an initialization decoding method of soft decoding of a staircase code according to a method embodiment five of the present application. With L=4, if soft information which is not subjected to a hard decision is received, the decoding method may choose multiple soft decoding algorithms.

When the number of subcode blocks initially received is less than 4, to perform soft decoding on received data is also recommended, so that when the number of received subcode blocks reaches 4, the decoding output will undergo complete iterative decoding twice (a complete iterative decoding includes a horizontal and a vertical decoding). The initialization decoding method of soft decoding of the staircase code of the method embodiment five of the present application shown in FIG. 6 is as follows.

When a first subcode block B1 is received, soft decoding is performed on [BT0, B1] (shown by the solid arrow 1 in the left figure of FIG. 6), and only soft information in code block B1 is updated, where T represents the transpose, and BT0 represents the transpose of an all zero code block.

When a second subcode block B2 is received, soft decoding is performed on [BT1, B2] (shown by the solid arrow 2 in the left figure of FIG. 6), and soft information in both code blocks B1 and B2 is updated, where BT1 represents the transpose of the updated subcode block B1.

When a third subcode block B3 is received, soft decoding is performed on [BT0, B1] and [BT2, B3] (shown by the solid arrows 3 and 4 in the left figure of FIG. 6), and soft information in code blocks B1, B2 and B3 is updated, where BT2 represents the transpose of the updated subcode block B2.

If the subcode block B0 is counted, 4 subcode blocks exist in the sliding window (shown by the slash section in the left figure of FIG. 6), but since the subcode block B0 is not a code block actually received, but an all zero code block agreed in the staircase code, there is no decoding output after the initialization decoding is completed. The new received code block is the subcode block B4, and in this case, the sliding window is slid rightwards by a length of 1 code block (shown by the slash section in the right figure of FIG. 6). In this case, 4 subcode blocks included in new positions of the sliding window are B1, B2, B3 and B4 respectively. In actual implementation, the sliding window corresponds to the buffer apparatus in a circuit.

Figure 7:
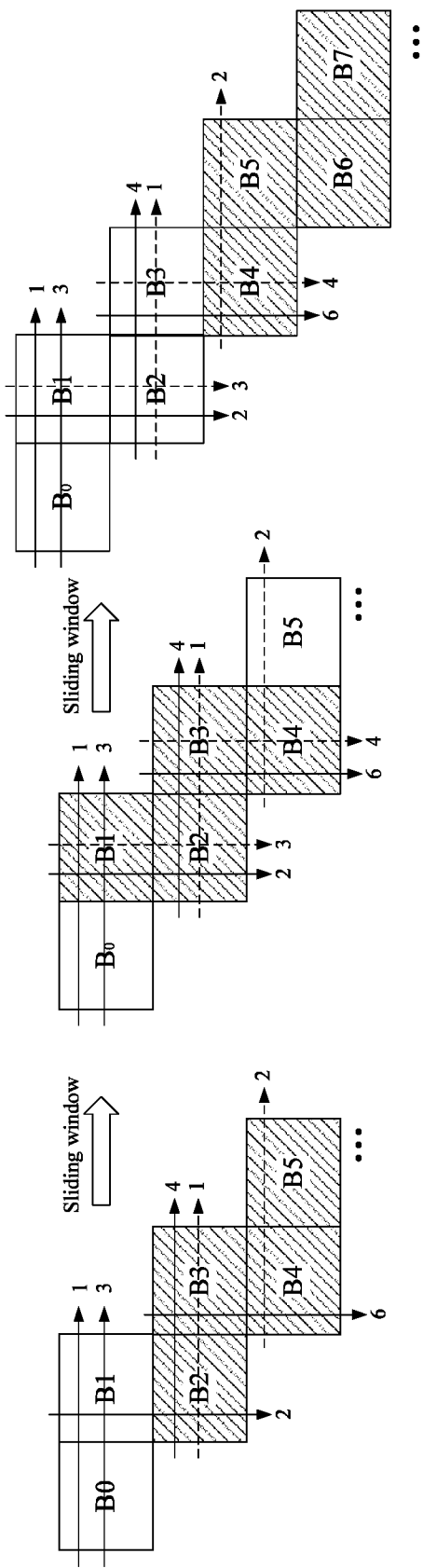
FIG. 7 is a flowchart of a decoding method of soft decoding of a staircase code according to a method embodiment five of the present application.

FIG. 7 is a flowchart of a decoding method of soft decoding of a staircase code according to a method embodiment five of the present application. If soft information which is not subjected to a hard decision is received, the decoding method may choose multiple soft decoding algorithms. The decoding method of soft decoding of the staircase code of the method embodiment five of the present application shown in FIG. 7 includes steps S12 to S26.

In step S21, 4 subcode blocks in the sliding window (shown by the slash section in FIG. 7) are divided into 2 groups by grouping two adjacent subcode blocks into one unit: [BT2, B3] and [BT4, B5] (where T represents the transpose); for the sake of convenience of the following description, these groups are respectively referred to as: B(1)=[BT2, B3] and B(2)=[BT4, B5].

In step S22, soft decoding is performed on code group units B(1) and B(2) respectively in rows (shown by dotted arrows 1 and 2 in the left figure of FIG. 7); at the same time, information of two subcode blocks in code blocks B(1) and B(2) is updated.

In step S23, the sliding window is slid forwards by a length of one code block, and 4 staircase code subcode blocks included in new positions of the sliding window are B1, B2, B3 and B4 respectively (shown by the slash section in FIG. 7); and these 4 subcode blocks are divided into 2 groups by grouping two adjacent subcode blocks into one unit: B(1)=[BT1, B2] and B(2)=[BT3, B4].

In step S24, soft decoding is performed on code group units B(1) and B(2) respectively (shown by dotted arrows 3 and 4 in FIG. 7); at the same time, soft information of code blocks B(1) and B(2) is updated, and B1 and B2 in B(1) are outputted after soft information is subjected to a hard decision; such outputted B1 and B2 also undergo iterative decoding twice.

In step S25, the sliding window is slid backwards a length of three code blocks, and 4 staircase code subcode blocks included in new positions of the sliding window are B4, B5, B6 and B7 respectively (shown by the slash section in the right figure of FIG. 7); and then operations in steps S21 to S24 are repeated, and corresponding hard-decision information of B3 and B4 in B(1) is outputted.

In step S26, operations in step S25 are repeated, so as to complete decoding output of B5, B6, . . . , and other staircase code subcode blocks.

Figure 8:
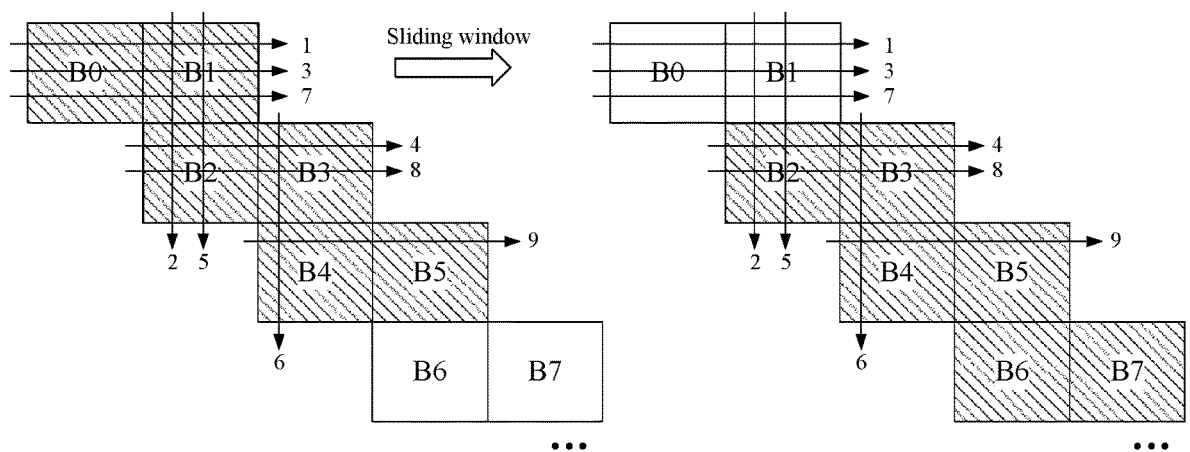
FIG. 8 is a flowchart of an initialization decoding method of a combination of hard and soft decoding of a staircase code according to a method embodiment six of the present application.

FIG. 8 is a flowchart of an initialization decoding method of a combination of hard and soft decoding of a staircase code according to a method embodiment six of the present application. In this embodiment, using L=6 as an example, when soft information which is not subjected to a hard decision is received, the decoding method is mixed decoding combining a hard decoding algorithm with a soft decoding algorithm, and when the number of subcode blocks received initially is less than 6, to perform soft decoding on received data is also recommended, so that when the number of received subcode blocks reaches 6, the decoding output will undergo complete iterative decoding three times (one iterative decoding includes a horizontal and a vertical decoding).

The initialization decoding method of the combination of hard and soft decoding of a staircase code according to the method embodiment six of the present application shown in FIG. 8 is as follows.

When a first subcode block B1 is received, soft decoding is performed on [BT0, B1] (shown by the solid arrow 1 in the left figure of FIG. 8), and only soft information in code block B1 is updated, where T represents the transpose, and BT0 represents the transpose of an all zero code block.

When a second subcode block B2 is received, soft decoding is performed on [BT1, B2] (shown by the solid arrow 2 in the left figure of FIG. 8), and soft information in both code blocks B1 and B2 is updated, where BT1 represents the transpose of the updated subcode block B1.

When a third subcode block B3 is received, soft decoding is performed on [BT0, B1] and [BT2, B3] (shown by the solid arrows 3 and 4 in the left figure of FIG. 8), and soft information in code blocks B1, B2 and B3 is updated, where BT2 represents the transpose of the updated subcode block B2.

When a fourth subcode block B4 is received, soft decoding is performed on [BT1, B2] and [BT3, B4] (shown by the solid arrows 5 and 6 in the left figure of FIG. 8), and soft information in code blocks B1, B2, B3 and B4 is updated, where BT3 represents the transpose of the updated subcode block B3.

When a fifth subcode block B5 is received, soft decoding is performed on [BT0, B1], [BT2, B3] and [BT4, B5] (shown by the solid arrows 7, 8 and 9 in the left figure of FIG. 8), and soft information in code blocks B1, B2, B3, B4 and B5 is updated, where BT4 represents the transpose of the updated subcode block B4.

If the subcode block B0 is counted, 6 subcode blocks exist in the sliding window (shown by the slash section in the left figure of FIG. 8), but since the subcode block B0 is not a code block actually received, but an all zero code block agreed in the staircase code, there is no decoding output after the initialization decoding is completed. The new received code block is the subcode block B6, and in this case, the sliding window is slid rightwards by a length of one code block (shown by the slash section in the right figure of FIG. 8). In this case, 6 subcode blocks included in new positions of the sliding window are B1, B2, B3, B4, B5 and B6 respectively. In actual implementation, the sliding window corresponds to the buffer apparatus in a circuit.

Figure 9:
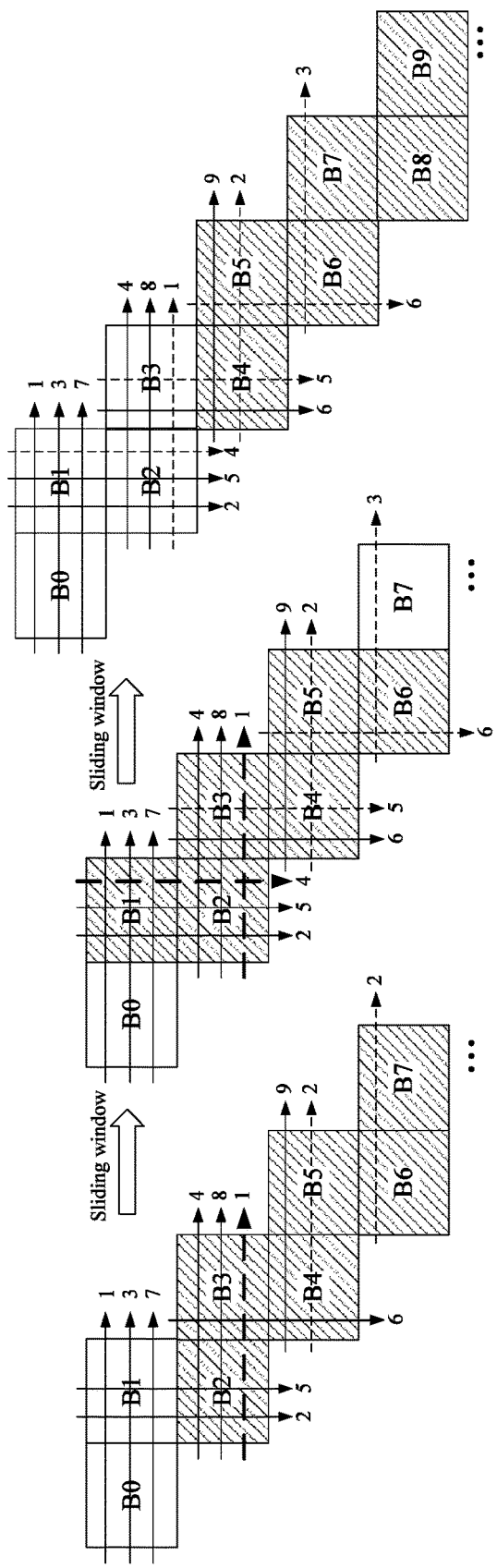
FIG. 9 is a flowchart of a decoding method of a combination of hard and soft decoding of a staircase code according to a method embodiment six of the present application.

FIG. 9 is a flowchart of a decoding method of a combination of hard and soft decoding of a staircase code according to a method embodiment six of the present application. In this embodiment, using L=6 as an example, when soft information which is not subjected to a hard decision, the decoding method is mixed decoding combining a hard decoding algorithm with a soft decoding algorithm. The decoding method of the combination of hard and soft decoding of a staircase code according to a method embodiment six of the present application shown in FIG. 9 includes steps S31 to S36.

In step S31, 6 subcode blocks in the sliding window (shown by the slash section in the left figure of FIG. 9) are divided into 3 groups by grouping two adjacent subcode blocks into one unit: [BT2, B3], [BT4, B5] and [BT6, B7] (where T represents the transpose); for the sake of convenience of the following description, these groups are respectively referred to as: B(1)=[BT2, B3], B(2)=[BT4, B5] and B(3)=[BT6, B7].

In step S32, soft information in B(1)=[BT2, B3] is subjected to a hard decision and hard decoding (shown by the thick dotted arrow 1 in the left figure of FIG. 9), and hard information in code block B(1) is updated; then soft decoding is performed on code group units B(2) and B(3) respectively in rows (shown by the dotted arrows 2 and 3 in the left figure of FIG. 9); at the same time, soft information of two subcode blocks in code blocks B(2) and B(3) is updated.

In step S33, the sliding window is slid forwards by a length of one code block, and 6 staircase code subcode blocks included in new positions of the sliding window are B1, B2, B3, B4, B5 and B6 respectively (shown by the slash section in FIG. 9); and these 6 subcode blocks are divided into 3 groups by grouping two adjacent subcode blocks into one unit: B(1)=[BT1, B2], B(2)=[BT3, B4] and B(3)=[BT5, B6].

In step S34, soft information in B(1)=[BT1, B2] is subjected to a hard decision and hard decoding (shown by the thick dotted arrow 4 in FIG. 9), and hard information in code block B(1) is updated; then soft decoding is performed on code group units B(2) and B(3) respectively in rows (shown by the dotted arrows 2 and 3 in FIG. 9); at the same time, soft information of two subcode blocks in code blocks B(2) and B(3) is updated.

In step S35, the sliding window is slid backwards a length of three code blocks, and 6 staircase code subcode blocks included in new positions of the sliding window are B4, B5, B6, B7, B8 and B9 respectively (shown by the slash section in the right figure of FIG. 9); and then operations in steps S31 to S34 are repeated, and corresponding hard-decision information of B3 and B4 in B(1) is outputted.

In step S36, operations in step S35 are repeated, so as to complete decoding output of B5, B6, . . . , and other staircase code subcode blocks.

Figure 10:
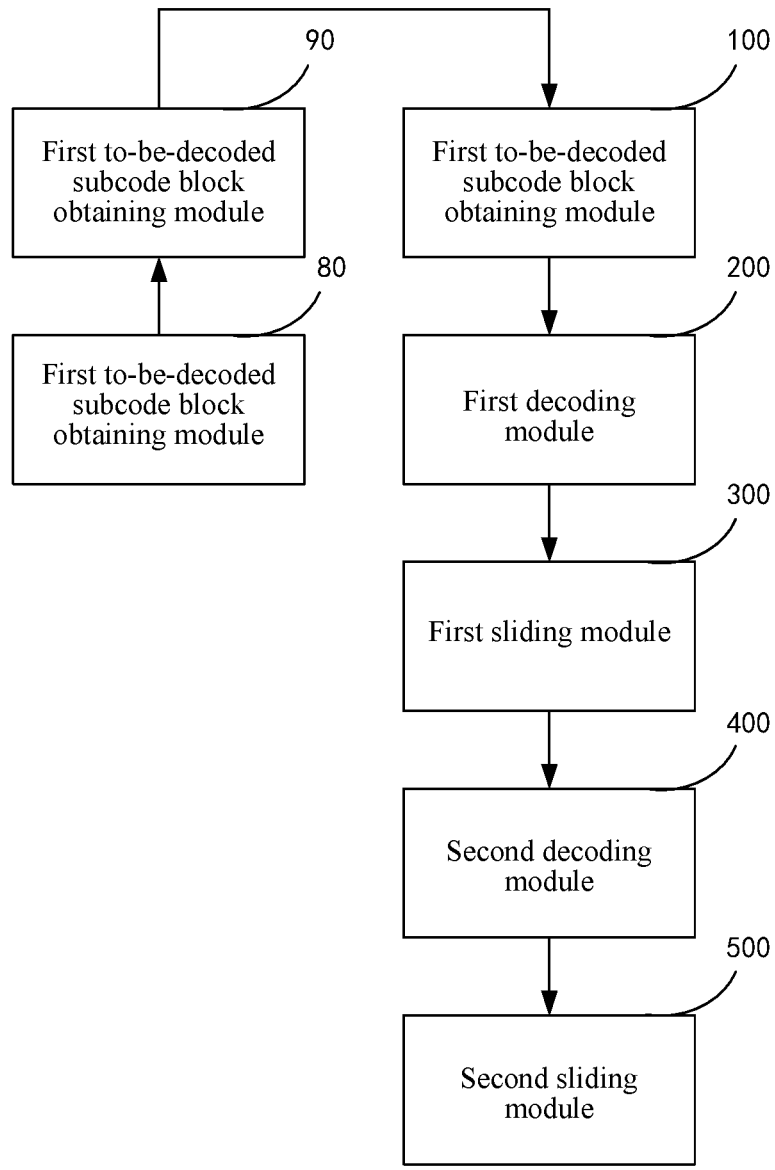
FIG. 10 is a structural diagram of a staircase code decoding apparatus according to a method embodiment seven of the present application.

FIG. 10 is a structural diagram of a staircase code decoding apparatus according to a method embodiment seven of the present application. The staircase code decoding apparatus in the method embodiment seven of the present application shown in FIG. 10 includes a to-be-decoded initial group obtaining module 80, a to-be-decoded initial group decoding module 90, a first to-be-decoded subcode block obtaining module 100, a first decoding module 200, a first sliding module 300, a second decoding module 400 and a second sliding module 500.

The to-be-decoded initial group obtaining module 80 is configured to, starting from reception of a first subcode block, group two adjacent subcode blocks into a group in a sequence, and obtain multiple initial to-be-decoded groups, one subcode block belongs to only one to-be-decoded initial group, where when a number of received subcode blocks is an odd number, a supplemented all zero code block and the subcode blocks are grouped.

L is an even number.

The to-be-decoded initial group decoding module 90 is configured to decode the multiple initial to-be-decoded groups, and return to trigger the to-be-decoded initial group obtaining module after the L subcode blocks are updated according to decoding results until an L-th subcode block is received.

The first to-be-decoded subcode block obtaining module 100 is configured to: obtain a length L of a sliding window, continuously obtain L subcode blocks, starting from a P-th subcode block, from the received subcode blocks received according to a front to back based on a receiving time, and use the continuously obtained L subcode blocks as first to-be-decoded subcode blocks in the sliding window, where P is a positive integer greater than or equal to 1, L is a positive integer, and in an embodiment, L is an even number. The first to-be-decoded subcode block obtaining module 100 is further configured to, when a first obtained subcode block is a subcode block first received in all the subcode blocks, supplement an all zero code block as a first subcode block to be decoded in the sliding window, and slide the L-th subcode block to be decoded in the sliding window out of the sliding window.

The first decoding module 200 is configured to divide the first to-be-decoded subcode blocks into multiple first to-be-decoded groups, respectively decode the multiple first to-be-decoded groups, and update the multiple first to-be-decoded groups according to a decoding result of the multiple first to-be-decoded groups to obtain first updated subcode blocks. The first decoding module 200 includes a first transposing unit, a first to-be-decoded group obtaining unit and a first decoding unit. The first transposing unit is configured to, from a first subcode block in the first to-be-decoded subcode blocks, transpose the first to-be-decoded subcode blocks at interval of one subcode block to obtain first to-be-decoded transposed subcode blocks. The first to-be-decoded group obtaining unit is configured to group each transposed subcode block in the first to-be-decoded transposed subcode blocks and an adjacent first subcode block to be decoded which is received later into a group to obtain the multiple first to-be-decoded groups. The first decoding unit is configured to respectively decode the multiple first to-be-decoded groups, and update the first to-be-decoded subcode blocks in the multiple first to-be-decoded groups according to the decoding result of the multiple first to-be-decoded groups to obtain the first updated subcode blocks. The first decoding module is further configured to, when the first to-be-decoded subcode blocks are codes which are subjected to a hard decision, perform decoding by using linear packet codes; and when the first to-be-decoded subcode blocks are not codes which are subjected to a hard decision, perform decoding by using a soft decoding algorithm. The first decoding module is further configured to update the first to-be-decoded groups other than the all zero code block according to the decoding result of the multiple first to-be-decoded groups to obtain the first updated subcode blocks.

The first sliding module 300 is configured to slide the sliding window forwards by a length of N subcode blocks according to the receiving time, and use the first updated subcode blocks remaining in the sliding window and the N subcode blocks slid into the sliding window as second to-be-decoded subcode blocks, where N is less than P, and in an embodiment, N is 1.

The second decoding module 400 is configured to divide the second to-be-decoded subcode blocks into multiple second to-be-decoded groups, decode the multiple second to-be-decoded groups, update the multiple second to-be-decoded groups according to a decoding result of the multiple second to-be-decoded groups to obtain second updated subcode blocks, and output first M subcode blocks in the second updated subcode blocks as the decoding result. The second decoding module 400 includes a second transposing unit, a second to-be-decoded group obtaining unit and a second decoding unit. The second transposing unit is configured to transpose the second to-be-decoded subcode blocks at an interval of one subcode block starting from a first subcode block in the second to-be-decoded subcode blocks to obtain second to-be-decoded transposed subcode blocks. The second to-be-decoded group obtaining unit is configured to group each transposed subcode block in the second to-be-decoded transposed subcode blocks and an adjacent second subcode block to be decoded which is received later into a group to obtain the multiple second to-be-decoded groups. The second decoding unit is configured to respectively decode the multiple second to-be-decoded groups, and update the second to-be-decoded subcode blocks in the multiple second to-be-decoded groups according to the decoding result of the multiple second to-be-decoded groups to obtain the second updated subcode blocks. In an embodiment, M is 2.

The second sliding module 500 is configured to slide the sliding window backwards by a length of S subcode blocks according to the receiving time, use the second updated subcode blocks remaining in the sliding window and the S subcode blocks slid into the sliding window as the first to-be-decoded subcode blocks, and return to trigger the first sliding module and the second decoding module until decoding results of all the subcode blocks are outputted, where S is a sum of M and N.

The staircase code decoding apparatus provided by this embodiment divides subcode blocks to be decoded in the sliding window into multiple groups, decodes the multiple groups respectively, re-groups and re-decodes second to-be-decoded subcode blocks to obtain second updated subcode blocks after the subcode blocks to be decoded are updated according to decoding results to obtain first updated subcode blocks and after the sliding window is slid forwards by N subcode blocks, slides the sliding window backwards by S subcode blocks after first M subcode blocks among the second updated subcode blocks are outputted as decoding results, where S is a sum of M and N, and then returns to the step of obtaining the first updated subcode blocks for iterative decoding, so as to output updated subcode blocks as decoding results. Each time decoding output of subcode blocks of a staircase code is completed, only a limited number of iterative decoding processes need to be performed, thereby reducing the implementation complexity of the hardware circuit, reducing the decoding delay, and improving the decoding performance.

The staircase code decoding apparatus provided by this embodiment divides subcode blocks to be decoded in the sliding window into multiple groups to be decoded, decodes the multiple groups to be decoded, after the subcode blocks to be decoded are updated according to decoding results to obtain updated subcode blocks, outputs first M subcode blocks in the updated subcode blocks as the decoding result, and repeats the above steps after the sliding window is slid backwards by S subcode blocks. By decoding and outputting updated subcode blocks respectively after grouping, and then repeating steps of grouping and decoding after sliding the sliding window to successively output updated subcode blocks as decoding results, each time decoding output of subcode blocks of a staircase code is completed, only a limited number of iterative decoding processes need to be performed, thereby greatly reducing the implementation complexity of the hardware circuit, reducing the decoding delay, and improving the decoding performance.

It will be understood by those of ordinary skill in the art that all or part of the steps in the method described above may be implemented by related hardware instructed by one or more programs, and these programs may be stored in a computer-readable storage medium such as a read only memory (ROM), a random access memory (RAM), a magnetic disk, an optical disk or the like.

The embodiments of the present application further provide a staircase code decoding method. The method includes steps 1 to 5 described below.

In step 1, a length L of a sliding window is obtained, L subcode blocks, starting from a P-th subcode block, are continuously obtained from received subcode blocks received according to a front to back order based a receiving time, and using the continuously obtained L subcode blocks as first to-be-decoded subcode blocks in the sliding window, where P is a positive integer greater than or equal to 1, and L is a positive integer.

In step 2, the first to-be-decoded subcode blocks are divided into multiple first to-be-decoded groups, the multiple first to-be-decoded groups are decoded respectively, and the multiple first to-be-decoded groups are updated according to a decoding result of the multiple first to-be-decoded groups to obtain first updated subcode blocks.

In step 3, the sliding window is slid forwards by a length of N subcode blocks according to the receiving time, and the first updated subcode blocks remaining in the sliding window and the N subcode blocks slid into the sliding window are used as second to-be-decoded subcode blocks, where N is less than P; and the second to-be-decoded subcode blocks are divided into multiple second to-be-decoded groups, the multiple second to-be-decoded groups are decoded, and the multiple second to-be-decoded groups are updated according to a decoding result of the multiple second to-be-decoded groups to obtain second updated subcode blocks.

In step 4, the sliding window is slid backwards by a length of N subcode blocks according to the receiving time, and the second updated subcode blocks remaining in the sliding window and the N subcode blocks slide into the sliding window are used as the first to-be-decoded subcode blocks, where N is less than P; and steps 2 and 3 are performed again, where this step is repeated K times, where K is an integer greater than or equal to 0, and when K is 0, which means that this step cannot be performed, directly go to step 5.

In step 5, after the second updated subcode blocks are obtained, first M subcode blocks in the second updated subcode blocks are outputted as the decoding results; and the sliding window is slid backwards by a length of S subcode blocks according to the receiving time, the second updated subcode blocks remaining in the sliding window and the S subcode blocks slide into the sliding window are used as the first to-be-decoded subcode blocks, and return to step 2, until the decoding result of all the subcode blocks are outputted.

In an embodiment, S is a sum of M and N.

In an embodiment, N=1, and M=1 or 2. When M=1, S=2 while when M=2, S=3.

Figure 11:
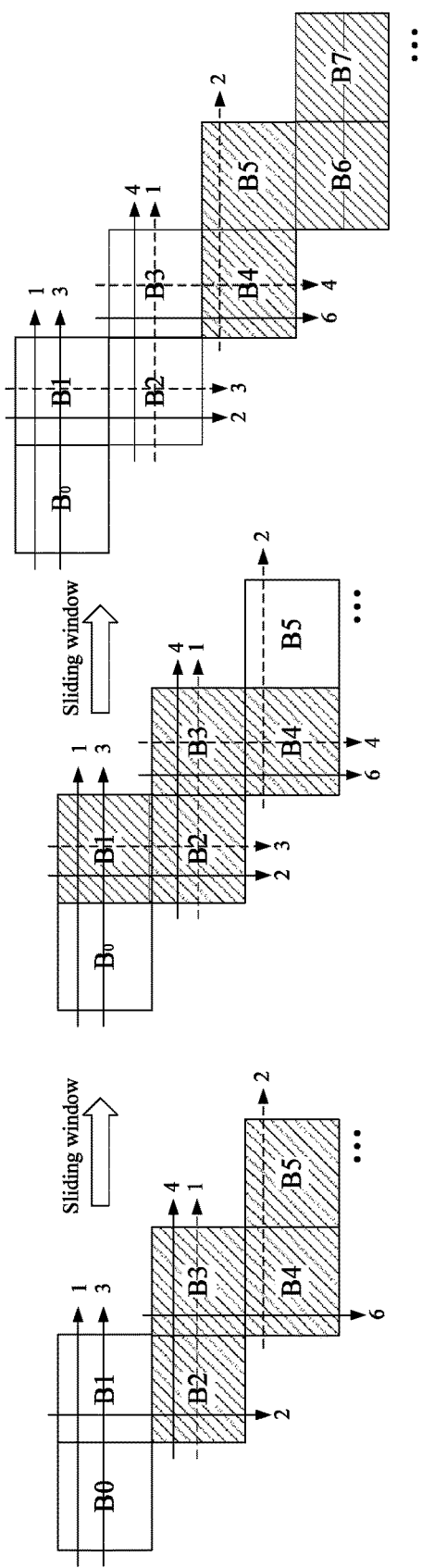
FIG. 11 is a flowchart of a staircase code decoding method according to a method embodiment eight of the present application.

FIG. 11 is a flowchart of a staircase code decoding method according to a method embodiment eight of the present application, as long as what is received is soft information or hard-decision information. The staircase code decoding method according to the method embodiment eight of the present application shown in FIG. 11 includes steps S81 to S86. It is assumed that the initialization has been completed in this embodiment in a manner similar to the manner in the embodiment 5.

In step S81, 4 subcode blocks in the sliding window (shown by the slash section in the left figure of FIG. 11) are divided into 2 groups by grouping two adjacent subcode blocks into one unit: [BT2, B3] and [BT4, B5] (where T represents the transpose); for the sake of convenience of the following description, these groups are respectively referred to as: B(1)=[BT2, B3] and B(2)=[BT4, B5].

In step S82, code group units B(1) and B(2) are decoded respectively in rows (shown by dotted arrows 1 and 2 in the left figure of FIG. 11); at the same time, information of two subcode blocks in code blocks B(1) and B(2) is updated.

In step S83, the sliding window is slid forwards by a length of one code block, and 4 staircase code subcode blocks included in new positions of the sliding window are B1, B2, B3 and B4 respectively (shown by the slash section in FIG. 11); and these 4 subcode blocks are divided into 2 groups by grouping two adjacent subcode blocks into one unit: B(1)=[BT1, B2] and B(2)=[BT3, B4]. Code group units B(1) and B(2) are decoded respectively (shown by dotted arrows 3 and 4 in FIG. 11); at the same time, information in code blocks B(1) and B(2) is updated.

In step S84, after the updated code blocks B(1) and B(2) are obtained, the sliding window is slid backwards by a length of one code block according to the receiving time, and 4 staircase code subcode blocks included in new positions of the sliding window are B2, B3, B4 and B5 respectively, where B(1)=[BT2, B3] and B(2)=[BT4, B5] (shown by the slash section in the left figure of FIG. 11); and then steps S82 and S83 are repeated, this step S84 is repeated twice, and corresponding information of B1 and B2 in B(1) is outputted.

In step S85, the sliding window is slid backwards by a length of three code blocks, and 4 staircase code subcode blocks included in new positions of the sliding window are B4, B5, B6 and B7 respectively (shown by the slash section in the right figure of FIG. 11); and then operations in steps S81 to S84 are repeated, and corresponding information of B3 and B4 in B(1) is outputted.

In step S86, operations in step S85 are repeated, so as to complete decoding output of B5, B6, . . . , and other staircase code subcode blocks.

Figure 12:
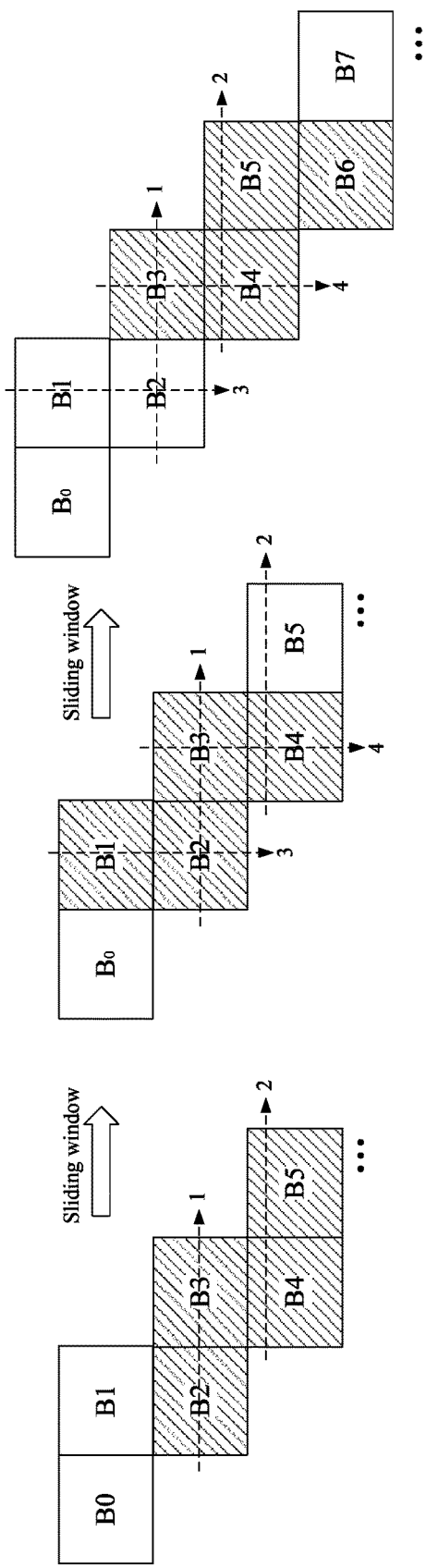
FIG. 12 is a flowchart of a staircase code decoding method according to a method embodiment nine of the present application.

FIG. 12 is a flowchart of a staircase code decoding method according to a method embodiment nine of the present application, as long as what is received is soft information or hard-decision information. The staircase code decoding method according to the method embodiment nine of the present application shown in FIG. 12 includes steps S91 to S96.

In step S91, 4 subcode blocks in the sliding window (shown by the slash section in the left figure of FIG. 12) are divided into 2 groups by grouping two adjacent subcode blocks into one unit: [BT2, B3] and [BT4, B5] (where T represents the transpose); for the sake of convenience of the following description, these groups are respectively referred to as: B(1)=[BT2, B3] and B(2)=[BT4, B5].

In step S92, code group units B(1) and B(2) are decoded respectively in rows (shown by dotted arrows 1 and 2 in the left figure of FIG. 12); at the same time, information of two subcode blocks in code blocks B(1) and B(2) is updated.

In step S93, the sliding window is slid forwards by a length of one code block, and 4 staircase code subcode blocks included in new positions of the sliding window are B1, B2, B3 and B4 respectively (shown by the slash section in FIG. 12); and these 4 subcode blocks are divided into 2 groups by grouping two adjacent subcode blocks into one unit: B(1)=[BT1, B2] and B(2)=[BT3, B4]. Code group units B(1) and B(2) are decoded respectively (shown by dotted arrows 3 and 4 in FIG. 12); at the same time, information in code blocks B(1) and B(2) is updated.

In step S94, after the updated code blocks B(1) and B(2) are obtained, the sliding window is slid backwards by a length of one code block according to the receiving time, and 4 staircase code subcode blocks included in new positions of the sliding window are B2, B3, B4 and B5 respectively, where B(1)=[BT2, B3] and B(2)=[BT4, B5] (shown by the slash section in the left figure of FIG. 12); and then steps S92 and S93 are repeated, this step S94 is repeated once, and corresponding information of B1 in B(1) is outputted.

In step S95, the sliding window is slid backwards by a length of two code blocks, and 4 staircase code subcode blocks included in new positions of the sliding window are B3, B4, B5 and B6 respectively (shown by the slash section in the right figure of FIG. 12); and then operations in steps S91 to S94 are repeated, and corresponding information of B2 in B(1) is outputted.

In step S96, operations in step S95 are repeated, so as to complete decoding output of B3, B4, . . . , and other staircase code subcode blocks.

For further limited content of the staircase code decoding method in this embodiment, reference may be made to the content of the staircase code decoding method in the preceding embodiments, which will not be repeated herein.

The embodiments of the present application further provide a staircase code decoding apparatus. The apparatus includes a first to-be-decoded subcode block obtaining module, a first decoding module, a first sliding module, a second decoding module and a second sliding module.

The first to-be-decoded subcode block obtaining module is configured to obtain a length L of a sliding window, continuously obtain L subcode blocks, starting from a P-th subcode block, from received subcode blocks received according to a front to back order based on a receiving time, and use the continuously obtained L subcode blocks as first to-be-decoded subcode blocks in the sliding window, where P is a positive integer greater than or equal to 1, and L is a positive integer.

The first decoding module is configured to divide the first to-be-decoded subcode blocks into multiple first to-be-decoded groups, decode the multiple first to-be-decoded groups respectively, and update the multiple first to-be-decoded groups according to a decoding result of the multiple first to-be-decoded groups to obtain first updated subcode blocks.

The first sliding module is configured to slide the sliding window forwards by a length of N subcode blocks according to the receiving time, and use the first updated subcode blocks remaining in the sliding window and the N subcode blocks slid into the sliding window as second to-be-decoded subcode blocks, where N is less than P; and divide the second to-be-decoded subcode blocks into multiple second to-be-decoded groups, decode the multiple second to-be-decoded groups, and update the multiple second to-be-decoded groups according to a decoding result of the multiple second to-be-decoded groups to obtain second updated subcode blocks.

The second sliding module is configured to slide the sliding window backwards by a length of N subcode blocks according to the receiving time, and use the second updated subcode blocks remaining in the sliding window and the N subcode blocks slid into the sliding window as the first to-be-decoded subcode blocks, where N is less than P; and trigger the first decoding module and the first sliding module; the second sliding module is triggered K times, where K is an integer greater than or equal to 0, and when K is 0, which means that this step the second sliding module cannot be [[performed]]triggered, the second sliding module is directly go to step 5 triggered.

The second sliding module is configured to, after the second updated subcode blocks are obtained, output first M subcode blocks in the second updated subcode blocks as the decoding results; and slide the sliding window backwards by a length of S subcode blocks according to the receiving time, use the second updated subcode blocks remaining in the sliding window and the S subcode blocks slide into the sliding window as the first to-be-decoded subcode blocks, and trigger the first decoding module and the second sliding module, until decoding results of all the subcode blocks are outputted.

In an embodiment, S is a sum of M and N.

In an embodiment, M is 1 or 2.

For further limited content of the staircase code decoding apparatus in this embodiment, reference may be made to the content of the staircase code decoding apparatus in the preceding embodiments, which will not be repeated herein.

The embodiments of the present application further provide a storage medium. The storage medium includes stored programs where the programs, when executed, perform the method of any one of the embodiments described above.

The embodiments of the present application further provide a processor. The processor is configured to execute programs which, when executed, perform the method of any one of the embodiments described above.

What is claimed is:

1. A staircase code decoding method, comprising:
    step 1, obtaining a length L of a sliding window, continuously obtaining, starting from a P-th subcode block, L subcode blocks from received subcode blocks received according to a front-to-back order based on receiving time, and using the continuously obtained L subcode blocks as first to-be-decoded subcode blocks in the sliding window, wherein P is a positive integer greater than or equal to 1, and L is a positive integer;
    step 2, dividing the first to-be-decoded subcode blocks into a plurality of first to-be-decoded groups, decoding the plurality of first to-be-decoded groups respectively, and updating the plurality of first to-be-decoded groups according to a decoding result of the plurality of first to-be-decoded groups to obtain first updated subcode blocks;
    step 3, sliding the sliding window forwards by a length of N subcode blocks according to the receiving time, and using first updated subcode blocks remaining in the sliding window and N subcode blocks slid into the sliding window as second to-be-decoded subcode blocks, wherein N is less than P;
    step 4, dividing the second to-be-decoded subcode blocks into a plurality of second to-be-decoded groups, decoding the plurality of second to-be-decoded groups, updating the plurality of second to-be-decoded groups according to a decoding result of the plurality of second to-be-decoded groups to obtain second updated subcode blocks, and outputting first M subcode blocks in the second updated subcode blocks as a decoding result; and
    step 5, sliding the sliding window backwards by a length of S subcode blocks according to the receiving time, using second updated subcode blocks remaining in the sliding window and S subcode blocks slid into the sliding window as the first to-be-decoded subcode blocks, and returning to step 2 to continue executing until decoding results of all the subcode blocks are outputted, wherein S is a sum of M and N, and L is an even number.

2. The method of claim 1, wherein N is 1.

3. The method of claim 1, wherein M is 2.

4. The method of claim 1, wherein the dividing the first to-be-decoded subcode blocks into the plurality of first to-be-decoded groups, decoding the plurality of first to-be-decoded groups respectively, and updating the plurality of first to-be-decoded groups according to the decoding result of the plurality of first to-be-decoded groups to obtain the first updated subcode blocks comprises:
    transposing the first to-be-decoded subcode blocks at an interval of one subcode block starting from a first subcode block in the first to-be-decoded subcode blocks to obtain first to-be-decoded transposed subcode blocks;
    grouping each transposed subcode block in the first to-be-decoded transposed subcode blocks and an adjacent first to-be-decoded subcode block which is received later than the transposed subcode block in the first to-be-decoded transposed subcode blocks into a group to obtain the plurality of first to-be-decoded groups; and
    decoding the plurality of first to-be-decoded groups respectively, and updating the first to-be-decoded subcode blocks in the plurality of first to-be-decoded groups according to the decoding result of the plurality of first to-be-decoded groups to obtain the first updated subcode blocks.

5. The method of claim 1, wherein the dividing the second to-be-decoded subcode blocks into the plurality of second to-be-decoded groups, decoding the plurality of second to-be-decoded groups, and updating the plurality of second to-be-decoded groups according to the decoding result of plurality of second to-be-decoded groups to obtain the second updated subcode blocks comprises:
    transposing the second to-be-decoded subcode blocks at interval of one subcode block starting from a first subcode block in the second to-be-decoded subcode blocks to obtain second to-be-decoded transposed subcode blocks;
    grouping each transposed subcode block in the second to-be-decoded transposed subcode blocks and an adjacent second to-be-decoded subcode block to be decoded which is received later than the transposed subcode block in the second to-be-decoded transposed subcode blocks into a group to obtain the plurality of second to-be-decoded groups; and
    decoding the plurality of second to-be-decoded groups respectively, and updating the second to-be-decoded subcode blocks in the plurality of second to-be-decoded groups according to the decoding result of the plurality of second to-be-decoded groups to obtain the second updated subcode blocks.

6. The method of claim 1, wherein the dividing the first to-be-decoded subcode blocks into the plurality of first to-be-decoded groups, and decoding the plurality of first to-be-decoded groups respectively comprises:
    in response to determining that the first to-be-decoded subcode blocks are codes which are subjected to a hard decision, performing decoding by using linear packet codes; and
    in response to determining that the first to-be-decoded subcode blocks are codes which are not subjected to a hard decision, performing decoding by using a soft decoding algorithm.

7. The method of claim 1, wherein the continuously obtaining the L subcode blocks and using the continuously obtained L subcode blocks as the first to-be-decoded subcode blocks in the sliding window comprises:
    when a first obtained subcode block is a subcode block first received in all the received subcode blocks, supplementing an all zero code block as a first subcode block to be decoded in the sliding window, and sliding an L-th subcode block to be decoded in the sliding window out of the sliding window;
    the updating the plurality of first to-be-decoded groups according to the decoding result of the plurality of first to-be-decoded groups to obtain the first updated subcode blocks comprises:
    updating the first to-be-decoded subcode blocks other than the all zero code block in the plurality of first to-be-decoded groups according to the decoding result of the plurality of first to-be-decoded groups to obtain the first updated subcode blocks.

8. The method of claim 7, wherein before the step 1, the method further comprises:
- step 100, starting from a subcode block first received in the received subcode blocks, grouping two adjacent subcode blocks into a group in a sequence, and obtaining a plurality of initial to-be-decoded groups, wherein one subcode block belongs to only one to-be-decoded initial group, wherein in response to determining that a number of the received subcode blocks is an odd number, supplementing an all zero code block to the received subcode blocks for grouping; and
- step 200, decoding the plurality of initial to-be-decoded groups, and returning to step 100 to continue executing after the subcode blocks are updated according to a decoding result of the plurality of initial to-be-decoded groups until an L-th subcode block is received.

9. A non-transitory storage medium, comprising stored programs, wherein the programs, when executed, perform the staircase code decoding method of claim 1.

10. A staircase code decoding method, comprising:
- step 1, obtaining a length L of a sliding window, continuously obtaining, starting from a P-th subcode block, L subcode blocks from received subcode blocks received according to a front-to-back order based on a receiving time, using the continuously obtained L subcode blocks as first to-be-decoded subcode blocks in the sliding window, wherein P is a positive integer greater than or equal to 1, and L is a positive integer;
- step 2, dividing the first to-be-decoded subcode blocks into a plurality of first to-be-decoded groups, decoding the plurality of first to-be-decoded groups respectively, and updating the plurality of first to-be-decoded groups according to a decoding result of the plurality of first to-be-decoded groups to obtain first updated subcode blocks;
- step 3, sliding the sliding window forwards by a length of N subcode blocks according to the receiving time, and using first updated subcode blocks remaining in the sliding window and N subcode blocks slid into the sliding window as second to-be-decoded subcode blocks, wherein N is less than P; and dividing the second to-be-decoded subcode blocks into a plurality of second to-be-decoded groups, decoding the plurality of second to-be-decoded groups respectively, and updating the plurality of second to-be-decoded groups according to a decoding result of the plurality of second to-be-decoded groups to obtain second updated subcode blocks;
- step 4, sliding the sliding window backwards by a length of N subcode blocks according to the receiving time, and using second updated subcode blocks remaining in the sliding window and N subcode blocks slid into the sliding window as the first to-be-decoded subcode blocks, wherein N is less than P; and performing steps 2 and 3 again; wherein the step 4 is repeated K times, wherein K is an integer greater than or equal to 0, and when K is 0, which means that step 4 is not capable of being performed, directly go to step 5; and
- step 5, after the second updated subcode blocks are obtained, outputting first M subcode blocks in the second updated subcode blocks as a decoding result; and sliding the sliding window backwards by a length of S subcode blocks according to the receiving time, using the second updated subcode blocks remaining in the sliding window and the S subcode blocks slid into the sliding window as the first to-be-decoded subcode blocks, and returning to step 2 to continue executing until the decoding result of all the subcode blocks are outputted, wherein S is a sum of M and N, and M is a positive integer less than 10.

11. The method of claim 10, wherein M is 1 or 2.

12. A non-transitory storage medium, comprising stored programs, wherein the programs, when executed, perform the staircase code decoding method of claim 10.

* * * * *